US010283947B2

(12) United States Patent
Chen et al.

(10) Patent No.: US 10,283,947 B2
(45) Date of Patent: May 7, 2019

(54) LOW-PROFILE CLIP WITH REDUCED ELECTRICAL NOISE

(71) Applicant: ARRIS Enterprises LLC, Suwanee, GA (US)

(72) Inventors: Edmund W. Chen, San Jose, CA (US); Gilbert W. VanHoy, San Jose, CA (US)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 15/534,484

(22) PCT Filed: Dec. 11, 2014

(86) PCT No.: PCT/US2014/069722
§ 371 (c)(1),
(2) Date: Jun. 8, 2017

(87) PCT Pub. No.: WO2016/093833
PCT Pub. Date: Jun. 16, 2016

(65) Prior Publication Data
US 2017/0353021 A1 Dec. 7, 2017

(51) Int. Cl.
H02G 3/04 (2006.01)
G06F 1/16 (2006.01)

(52) U.S. Cl.
CPC ......... H02G 3/0456 (2013.01); G06F 1/1683 (2013.01); H01L 2924/00014 (2013.01)

(58) Field of Classification Search
CPC .................................... H02G 3/0456
USPC .......................... 174/70 C, 70 R
See application file for complete search history.

(56) References Cited

U.S. PATENT DOCUMENTS

| 2010/0095492 A1 | 4/2010 | Boone | 24/457 |
| 2012/0104186 A1 | 5/2012 | Shirley | 248/74.1 |
| 2013/0111922 A1 | 5/2013 | Parry-Jones et al. | 60/784 |
| 2014/0011453 A1* | 1/2014 | Kuroda | H01L 23/3128 455/41.2 |
| 2014/0151116 A1* | 6/2014 | Doshita | H02G 3/32 174/70 R |
| 2014/0166823 A1* | 6/2014 | Tang | G06F 1/189 248/49 |

OTHER PUBLICATIONS

International Search Report and Written Opinion for PCT/US2014/069722, dated Aug. 28, 2015.
http://www.panduit.com/wcs/Satellite?c=Page&childpagename=Panduit_Global%2FPG_Layout&cid=1345564328975&packedargs=classification_id%3D171%26item_id%3DA1C12-A-C8%26locale%3Den_us&pagename=PG_Wrapper, Publication date unknown.

* cited by examiner

Primary Examiner — Timothy J Thompson
Assistant Examiner — Charles Pizzuto
(74) Attorney, Agent, or Firm — Stewart M. Wiener; Steven E. Stupp

(57) ABSTRACT

A reduced or low-profile mechanical clip is described. This mechanical clip may include a trench that constrains the mechanical degrees of freedom of wires, such as those between an interface circuit and an antenna in an electronic device. Moreover, the mechanical clip may have a low height (such as less than 3 mm) so it can fit in a confined space between components in the interior of the electronic device. The mechanical clip may be mountable on a surface in the interior of the electronic device, such as on a printed circuit board or on an inner surface of a chassis or external housing of the electronic device.

11 Claims, 4 Drawing Sheets

LOW-PROFILE CLIP WITH REDUCED ELECTRICAL NOISE

CROSS REFERENCE TO RELATED APPLICATIONS

This application claims priority under 35 U.S.C. 371 to International Application No. PCT/US2014/069722, "Low-Profile Clip for Reduced Electrical Noise," by Edmund W. Chen, et al., filed on Dec. 11, 2014, the contents of which are herein incorporated by reference.

BACKGROUND

Field

The described embodiments relate to the design of a mechanical clip. In particular, the described embodiments relate to the design of a mechanical clip for constraining wires in electronic devices.

Related Art

Many electronic devices are capable of wirelessly communicating with other electronic devices. For example, these electronic devices can include a networking subsystem that implements a network interface for: a cellular network (UMTS, LTE, etc.), a wireless local area network (e.g., a wireless network such as described in the Institute of Electrical and Electronics Engineers (IEEE) 802.11 standard or Bluetooth from the Bluetooth Special Interest Group of Kirkland, Washington), and/or another type of wireless network. Typically, the networking subsystem includes an interface circuit that is electrically coupled to one or more antennas by wires.

However, wires routed across printed circuit boards to peripheral components (such as antennas, switches, light emitting diodes, input/output circuits, etc.) often cause a moderate reduction in the performance of electronic devices. In particular, a motion of a wire can cause an induced current in the wire, which becomes radio-frequency electrical noise. In addition, changes in wire routing during assembly of an electronic device can result in variations in the directional loss or gain associated with the current moving through the wire.

In principle, the noise magnitude and variation of noise in electronic devices can be reduced by routing wires as close as possible to printed circuit board or chassis, and in a reliable and uniform manner during assembly. Existing manufacturing techniques for routing and securing wires in electronic devices during assembly involve the use of tape or an adhesive, such as glue. However, these manufacturing techniques are costly, and have reliability and repeatability problems.

SUMMARY

The described embodiments relate to a mechanical clip. This mechanical clip includes a housing with a base having a first surface, where the housing has a housing height relative to the first surface, a housing width, a housing length and a housing thickness. The housing includes a trench, defined by an edge, adjacent to the first surface, with a trench depth, a trench width and a trench length. The housing also includes a lip, adjacent to the trench and on an opposite side of the trench from the first surface, having a second surface. This trench mechanically constrains wires to reduce mechanical degrees of freedom of the wires. In addition, the housing height is less than a predefined value (e.g., 3 mm) so that the mechanical clip has a reduced profile.

Note that the mechanical clip may be fabricated using injection molding. Consequently, the housing thickness may be approximately constant. Alternatively, the mechanical clip may be machined.

Moreover, the first surface may include an adhesive or a tape (such as two-sided tape) so that the first surface can be mechanically coupled to another surface.

Furthermore, the second surface may be recessed along a direction of the housing height from the first surface. In some embodiments, the housing includes a beveled edge along one side of the second surface. Either or both of these features may allow the wires to be positioned in the trench when the first surface is mechanically coupled to the other surface.

Additionally, the trench width may approximately equal a sum of diameters of three of the wires.

Note that the trench may make contact with the wires at two locations along the trench length.

Moreover, the reduced mechanical degrees of freedom may reduce electrical noise associated with motion of the wires.

Another embodiment provides an electronic device that includes: one or more pads (which may be coupled to an antenna), wires coupled to the one or more pads, an interface circuit coupled to the one or more pads by the wires, and the mechanical clip constraining the mechanical degrees of freedom of the wires. Moreover, the reduced profile of the housing may correspond to a space between components within the electronic device.

In some embodiments, the electronic device includes a circuit board, and the first surface is mechanically coupled to the circuit board. Alternatively, the electronic device may include an external housing, and the first surface may be mechanically coupled to an inner surface of the external housing. Note that the mechanical coupling of the first surface to the circuit board or the external housing may be rigid and/or remateable.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

A reduced or low-profile mechanical clip is described. This mechanical clip may include a trench that constrains the mechanical degrees of freedom of wires, such as those between an interface circuit and an antenna in an electronic device. Moreover, the mechanical clip may have a low height (such as less than 3 mm) so it can fit in a confined space between components in the interior of the electronic device. The mechanical clip may be mountable on a surface in the interior of the electronic device, such as on a printed circuit board or on an inner surface of a chassis or external housing of the electronic device. By mechanically constraining the mechanical degrees of freedom of the wires, the mechanical clip may reduce electrical noise induced by motion of the wires. In addition, the mechanical clip may facilitate low-cost reproducible assembly of the electronic device.

Figure 1:
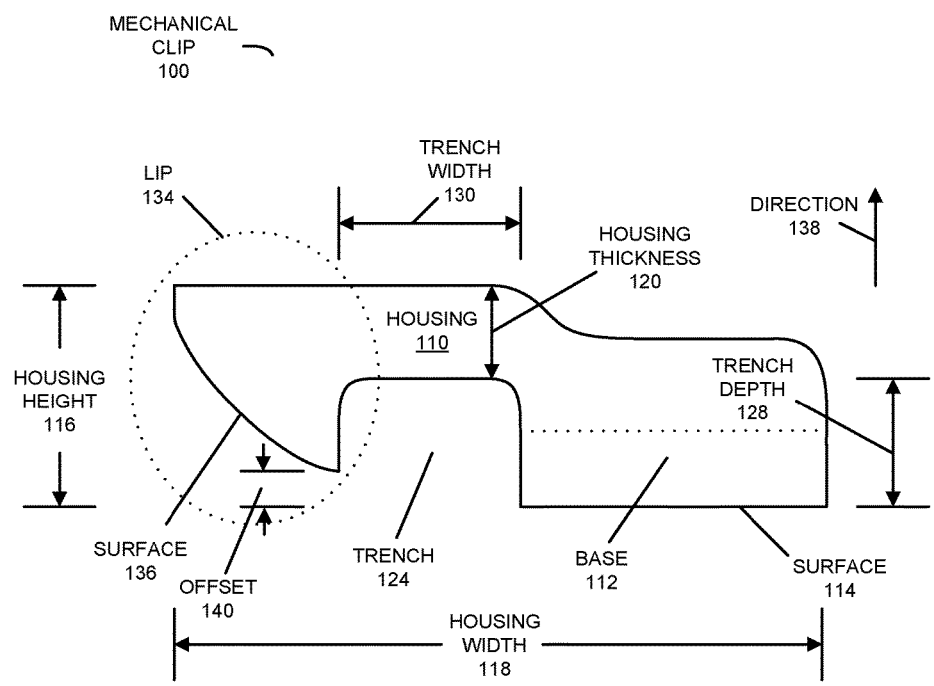
FIG. 1 is a block diagram illustrating a side view of a mechanical clip in accordance with an embodiment of the present disclosure.
Figure 2:
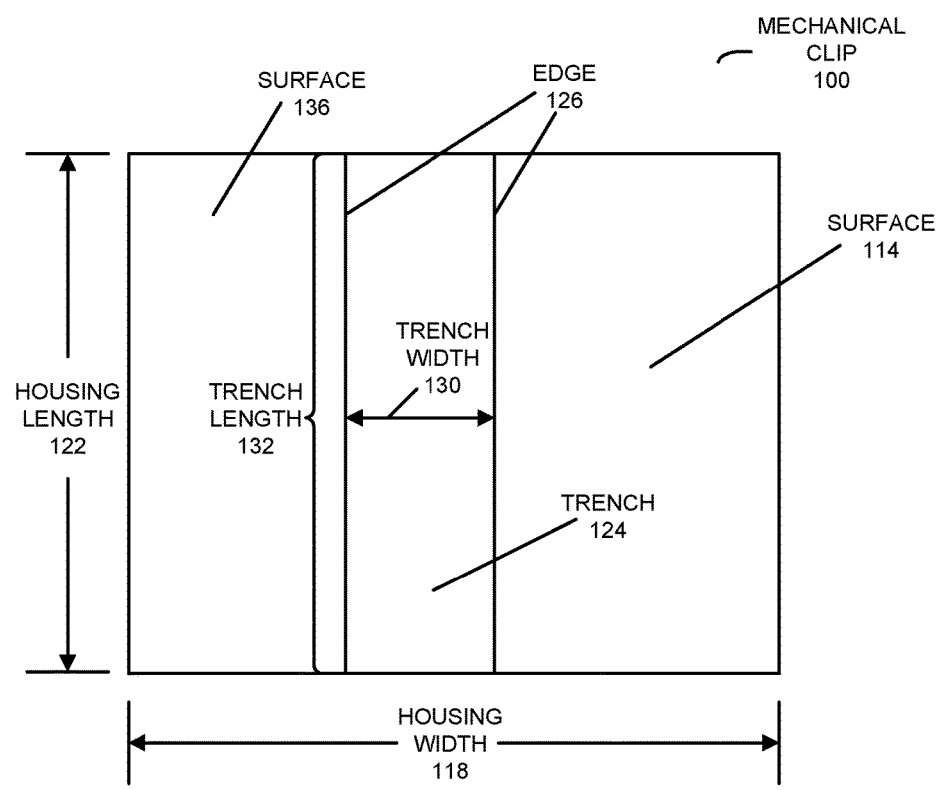
FIG. 2 is a block diagram illustrating a bottom view of the mechanical clip of FIG. 1 in accordance with an embodiment of the present disclosure.

We now describe the mechanical clip (which is sometimes referred to as a 'cable-management clip'). FIG. 1 presents a block diagram illustrating a side view of a mechanical clip 100. This mechanical clip includes a housing 110 with a base 112 having a surface 114, where housing 110 has a housing height 116 relative to surface 114 (such as less than 3 mm), a housing width 118 (such as 9-10 mm), and a housing thickness 120 (such as 1-2 mm). Moreover, as shown in FIG. 2, which presents a bottom view of mechanical clip 100, housing 110 has a housing length 122 (such as 8-12 mm). Furthermore, housing 110 includes a trench 124, defined by an edge 126, adjacent to surface 114, with a trench depth 128 in FIG. 1 (such as 1.5 mm), a trench width 130 (such as 3.5 mm) and a trench length 132 (such as 8-12 mm).

Referring back to FIG. 1, housing 110 may include a lip 134, adjacent to trench 124 and on an opposite side of trench 124 from surface 114, having a surface 136, which may or may not be approximately parallel to surface 114.

Figure 3:
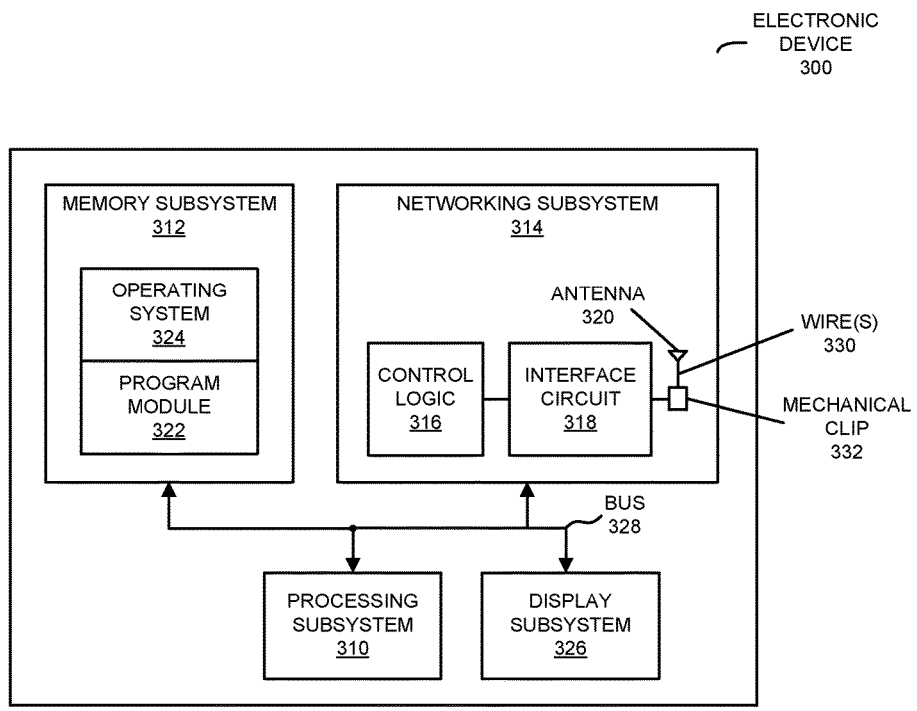
FIG. 3 is a block diagram illustrating an electronic device that includes the mechanical clip of FIGS. 1 and 2 in accordance with an embodiment of the present disclosure.

Note that trench 124 may mechanically constrain one or more wires (which are placed in trench 124) to reduce mechanical degrees of freedom of the one or more wires, such as motion of the one or more wires. For example, trench 124 may be designed to mechanically constrain one or more wires that each have a diameter of 1.37 mm. In addition, housing height 116 is less than a predefined value (e.g., 3 mm) so that mechanical clip 100 has a reduced profile. This may allow mechanical clip 100 to be used in a confined space, such as a space between components inside of electronic device 300 (FIG. 3).

Mechanical clip 100 may be fabricated using injection molding. For example, mechanical clip 100 may be a polymer. Consequently, housing thickness 120 may be approximately constant and/or the walls of housing 110 may have a draft angle so mechanical clip 100 can be removed from a mold. Alternatively, mechanical clip 100 may be machined, e.g., using a grinding machine or a milling machine. However, a wide variety of fabrication techniques may be used, including: three-dimensional printing, casting, photolithography, and/or different types of molding (blow molding, powder metallurgy plus sintering, compression molding, expandable bead molding, extrusion molding, foam molding, injection molding, laminating, reaction injection molding, matched molding, matrix molding, plastic molding, pressure plug assist molding, rotational molding or rotomolding, spin casting, transfer molding, thermoforming, vacuum forming, and/or vacuum plug assist molding. In addition, a wide variety of materials may be used to fabricate mechanical clip 100, including: a metal, a semiconductor, an organic material (such as a plastic or nylon) and/or an inorganic material.

As described below with reference to FIG. 3, surface 114 may include an adhesive or a tape (such as two-sided tape) so that surface 114 can be mechanically coupled to another surface, such as the inner surface of a chassis or an external housing of an electronic device or a surface of a printed circuit board in the electronic device. The mechanical coupling of surface 114 to the circuit board or the external housing may be rigid and/or remateable. The latter may allow the electronic device to be reworked. In addition, it may provide flexibility in the placement or location of mechanical clip 100 inside of the electronic device. This flexibility may allow the fabrication or assembly process to be modified or optimized, as needed (as opposed to requiring that the placement of mechanical clip 100 be predefined well in advance of fabrication of the electronic device, which may be cumbersome and which may make it more difficult to fabricate the electronic device).

Furthermore, surface 136 may be recessed or offset 140 along a direction 138 of housing height 116 from surface 114 (thus, surfaces 114 and 136 may not be coplanar). For example, offset 140 may be 0.25 mm. In some embodiments, lip 134 includes a beveled edge along one side of surface 136. By recessing surface 136 relative to surface 114 and/or including the beveled edge, mechanical clip 100 may allow the wires to be positioned in trench 124 when surface 114 is mechanically coupled to the other surface without damaging the wires. In addition, by placing or positioning the wires in trench 124 after surface 114 is mechanically coupled to the other surface, mechanical clip 100 may facilitate reliable and reproducible assembly of the electronic device. For example, the routing path of the wires may be consistent from one instance of the electronic device to another.

In general, trench 124 may make contact with the wires in at least two locations along trench length 132 (FIG. 2). However, trench 124 may constrain the wires at more locations or along the entirety of trench length 132 (FIG. 2). By constraining the wires in this way, mechanical clip 100 may reduce electrical noise associated with motion of the wires. Thus, mechanical clip 100 may improve the performance of the electronic device, such as a performance metric associated with radio-frequency communication. For example, the performance metric may include: a data rate, a data rate for successful communication (which is sometimes referred to as a 'throughput'), an error rate (such as a retry or resend rate), a mean-square error of equalized signals relative to an equalization target, intersymbol interference, a signal-to-noise ratio, a width of an eye pattern, a ratio of number of bytes successfully communicated during a time interval (such as 1-10 s) to an estimated maximum number of bytes that can be communicated in the time interval (the latter of which is sometimes referred to as the 'capacity' of a communication channel or link), and/or a ratio of an actual data rate to an estimated data rate (which is sometimes referred to as 'utilization').

In an exemplary embodiment, mechanical clip 100 is used to clip single strand, very small gauge wires, such as 20 ga through 34 ga. For example, trench width 130 (FIG. 2) may approximately equal a sum of diameters of one to three of the wires. Thus, trench width 130 (FIG. 2) may be 2.5 to 3 mm. Moreover, mechanical clip 100 may have a low profile (such as a housing height 116 of 2.7 mm) with a very high bond strength mechanical coupling to the other surface. This may allow mechanical clip 100 to be precisely located on the printed circuit board or chassis, and may provide, quick, accurate, repeatable wire routing along the face of the printed circuit board, external housing or chassis without the use of glues or tapes.

We now describe the electronic device. FIG. 3 presents a block diagram illustrating an electronic device 300. This electronic device includes processing subsystem 310, memory subsystem 312, and networking subsystem 314. Processing subsystem 310 includes one or more devices configured to perform computational operations. For example, processing subsystem 310 can include one or more microprocessors, application-specific integrated circuits (ASICs), microcontrollers, programmable-logic devices, and/or one or more digital signal processors (DSPs).

Memory subsystem 312 includes one or more devices for storing data and/or instructions for processing subsystem 310 and networking subsystem 314. For example, memory subsystem 312 can include dynamic random access memory (DRAM), static random access memory (SRAM), and/or other types of memory. In some embodiments, instructions for processing subsystem 310 in memory subsystem 312 include: one or more program modules or sets of instructions (such as program module 322 or operating system 324), which may be executed by processing subsystem 310. Note that the one or more computer programs may constitute a computer-program mechanism. Moreover, instructions in the various modules in memory subsystem 312 may be implemented in: a high-level procedural language, an object-oriented programming language, and/or in an assembly or machine language. Furthermore, the programming language may be compiled or interpreted, e.g., configurable or configured (which may be used interchangeably in this discussion), to be executed by processing subsystem 310.

In addition, memory subsystem 312 can include mechanisms for controlling access to the memory. In some embodiments, memory subsystem 312 includes a memory hierarchy that comprises one or more caches coupled to a memory in electronic device 300. In some of these embodiments, one or more of the caches is located in processing subsystem 310.

In some embodiments, memory subsystem 312 is coupled to one or more high-capacity mass-storage devices (not shown). For example, memory subsystem 312 can be coupled to a magnetic or optical drive, a solid-state drive, or another type of mass-storage device. In these embodiments, memory subsystem 312 can be used by electronic device 300 as fast-access storage for often-used data, while the mass-storage device is used to store less frequently used data.

Networking subsystem 314 includes one or more devices configured to couple to and communicate on a wired and/or wireless network (i.e., to perform network operations), including: control logic 316, an interface circuit 318 (which is sometimes referred to as a 'means for communicating') and one or more antennas, such as antenna 320. (While FIG. 3 includes antenna 320, in some embodiments electronic device 300 includes one or more nodes, such as one or more pads, which can be coupled to the one or more antennas. Thus, electronic device 300 may or may not include the one or more antennas.) For example, networking subsystem 314 can include a Bluetooth networking system (based on Bluetooth from the Bluetooth Special Interest Group of Kirkland, Wash.), a cellular networking system (e.g., a 3G/4G network such as UMTS, LTE, etc.), a universal serial bus (USB) networking system, a networking system based on the standards described in IEEE 802.11 (e.g., a Wi-Fi networking system based on Wi-Fi from the Wi-Fi Alliance of Austin, Tex.), an Ethernet networking system, and/or another networking system. Note that antenna 320 may be electrically coupled to interface circuit 318 by one or more connectors, such as wires 330, and wires 330 may be secured using mechanical clip 332. For example, wires 330 may be mechanically coupled by mechanical clip 332 to a printed circuit board and/or a chassis (or external housing) of electronic device 300.

Networking subsystem 314 includes processors, controllers, radios/antennas, sockets/plugs, and/or other devices used for coupling to, communicating on, and handling data and events for each supported networking system. Note that mechanisms used for coupling to, communicating on, and handling data and events on the network for each network system are sometimes collectively referred to as a 'network interface' for the network system. Moreover, in some embodiments a 'network' between the electronic devices does not yet exist. Therefore, electronic device 300 may use the mechanisms in networking subsystem 314 for performing simple wireless communication between the electronic devices, e.g., transmitting advertising or beacon frames and/or scanning for advertising frames transmitted by other electronic devices as described previously.

Within electronic device 300, processing subsystem 310, memory subsystem 312, and networking subsystem 314 are coupled together using bus 328. Bus 328 may include an electrical, optical, and/or electro-optical connection that the subsystems can use to communicate commands and data among one another. Although only one bus 328 is shown for clarity, different embodiments can include a different number or configuration of electrical, optical, and/or electro-optical connections among the subsystems.

In some embodiments, electronic device 300 includes a display subsystem 326 for displaying information on a display, which may include a display driver and the display, such as a liquid-crystal display, a multi-touch touchscreen, etc.

Electronic device 300 can be (or can be included in) any electronic device with at least one network interface. For example, electronic device 300 can be (or can be included in): a desktop computer, a laptop computer, a subnotebook/netbook, a server, a tablet computer, a smartphone, a cellular telephone, a consumer-electronic device, a portable computing device, an access point, a router, a switch, communication equipment, test equipment, and/or another electronic device.

Although specific components are used to describe electronic device 300, in alternative embodiments, different components and/or subsystems may be present in electronic device 300. For example, electronic device 300 may include one or more additional processing subsystems, memory subsystems, networking subsystems, display subsystems and/or user-interface subsystems. Additionally, one or more of the subsystems may not be present in electronic device 300. Moreover, in some embodiments, electronic device 300 may include one or more additional subsystems that are not shown in FIG. 3. Also, although separate subsystems are shown in FIG. 3, in some embodiments, some or all of a given subsystem or component can be integrated into one or more of the other subsystems or component(s) in electronic device 300. For example, in some embodiments program module 322 is included in operating system 324.

Moreover, the circuits and components in electronic device 300 may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar.

An integrated circuit may implement some or all of the functionality of networking subsystem 314, such as a radio. Moreover, the integrated circuit may include hardware and/or software mechanisms that are used for transmitting wireless signals from electronic device 300 and receiving signals at electronic device 300 from other electronic devices. Aside from the mechanisms herein described, radios are generally known in the art and hence are not described in detail. In general, networking subsystem 314 and/or the integrated circuit can include any number of radios. Note that the radios in multiple-radio embodiments function in a similar way to the described single-radio embodiments.

In some embodiments, networking subsystem 314 and/or the integrated circuit include a configuration mechanism (such as one or more hardware and/or software mechanisms) that configures the radio(s) to transmit and/or receive on a given communication channel (e.g., a given carrier frequency). For example, in some embodiments, the configuration mechanism can be used to switch the radio from monitoring and/or transmitting on a given communication channel to monitoring and/or transmitting on a different communication channel. (Note that 'monitoring' as used herein comprises receiving signals from other electronic devices and possibly performing one or more processing operations on the received signals, e.g., determining if the received signal comprises an advertising frame, calculating the estimated throughput metric, etc.)

Figure 4:
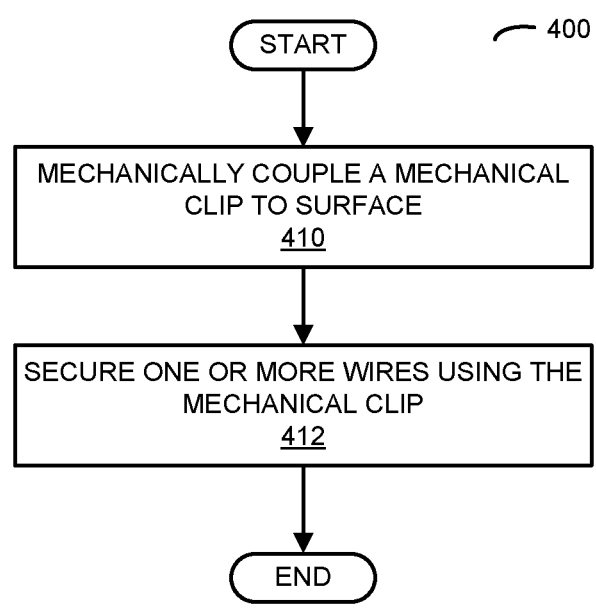
FIG. 4 is a flow diagram illustrating a method for assembling the electronic device of FIG. 3 in accordance with an embodiment of the present disclosure.

We now describe embodiments of a method. FIG. 4 presents a flow diagram illustrating a method 400 for assembling an electronic device (such as electronic device 300 in FIG. 3) using a mechanical clip (such as mechanical clip 100 in FIGS. 1 and 2). During this method, the mechanical clip is mechanically coupled to a surface (operation 410) in the electronic device. Then, one or more wires are secured (operation 412) using the mechanical clip. For example, the mechanical clip may constrain the mechanical degrees of freedom of the one or more wires.

In some embodiments of method 400, there are additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments. Moreover, note that the numerical values provided are intended as illustrations of the communication technique. In other embodiments, the numerical values can be modified or changed.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An electronic device, comprising:
   one or more pads configured to couple to an antenna;
   wires electrically coupled to the one or more pads;
   an interface circuit, electrically coupled to the one or more pads by the wires, configured to communicate with another electronic device; and
   a mechanical clip mechanically coupled to the wires, wherein the mechanical clip includes:
      a housing with a base having a first surface, wherein the housing has a housing height relative to the first surface, a housing width, a housing length and a housing thickness;
      wherein the housing includes a trench, defined by an edge, adjacent to the base, with a trench depth, a trench width and a trench length;
      wherein the housing includes a lip, adjacent to the trench and on an opposite side of the trench from the first surface, having a second surface;
      wherein the wires are positioned in the trench so that the mechanical clip mechanically constrains the wires to reduce mechanical degrees of freedom of the wires; and
      wherein the housing height is less than a predefined value so that the mechanical clip has a reduced profile corresponding to a space between components within the electronic device.

2. The electronic device of claim 1, further comprising a circuit board, wherein the first surface is mechanically coupled to the circuit board.

3. The electronic device of claim 2, wherein the mechanical coupling of the first surface to the circuit board is remateable.

4. The electronic device of claim 1, further comprising an external housing of the electronic device, wherein the first surface is mechanically coupled to an inner surface of the external housing.

5. The electronic device of claim 4, wherein the mechanical coupling of the first surface to the circuit board is remateable.

6. The electronic device of claim 1, wherein the second surface is recessed along a direction of the housing height from the first surface.

7. The electronic device of claim 1, wherein the trench width approximately equals a sum of diameters of three of the wires.

8. The electronic device of claim 1, wherein the housing includes a beveled edge along one side of the second surface.

9. The electronic device of claim 1, wherein the trench is configured to have contact with the wires at two locations along the trench length.

10. The electronic device of claim 1, wherein the reduced mechanical degrees of freedom reduce electrical noise associated with motion of the wires.

11. An electronic device, comprising:
    one or more pads configured to couple to an antenna;
    wires electrically coupled to the one or more pads;
    means for communicating with another electronic device, wherein the means is coupled to the one or more pads by the wires; and
    a mechanical clip mechanically coupled to the wires, wherein the mechanical clip includes:
       a housing with a base having a first surface, wherein the housing has a housing height relative to the first surface, a housing width, a housing length and a housing thickness;
       wherein the housing includes a trench, defined by an edge, adjacent to the base, with a trench depth, a trench width and a trench length;
       wherein the housing includes a lip, adjacent to the trench and on an opposite side of the trench from the first surface, having a second surface;

wherein the wires are positioned in the trench so that the mechanical clip mechanically constrains the wires to reduce mechanical degrees of freedom of the wires; and wherein the housing height is less than a predefined value so that the mechanical clip has a reduced profile corresponding to a space between components within the electronic device.

* * * * *